United States Patent
Shim et al.

(10) Patent No.: US 11,487,396 B2
(45) Date of Patent: Nov. 1, 2022

(54) TOUCH DISPLAY DEVICE AND TOUCH DRIVING METHOD HEREOF

(71) Applicant: LG DISPLAY CO., LTD., Seoul (KR)

(72) Inventors: HoanSu Shim, Incheon (KR); JuHan Kim, Gyeonggi-do (KR); Wonjoung Kim, Seoul (KR); Yeonock Ha, Gyeonggi-do (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/374,896

(22) Filed: Jul. 13, 2021

(65) Prior Publication Data
US 2022/0066594 A1     Mar. 3, 2022

(30) Foreign Application Priority Data

Sep. 3, 2020    (KR) ........................ 10-2020-0112064

(51) Int. Cl.
*G06F 3/044*     (2006.01)
*G06F 3/041*     (2006.01)

(52) U.S. Cl.
CPC .......... *G06F 3/0446* (2019.05); *G06F 3/0412* (2013.01); *G06F 3/04182* (2019.05); *G06F 3/04186* (2019.05)

(58) Field of Classification Search
CPC .. G06F 3/04186; G06F 3/0446; G06F 3/0412; G06F 3/04182; G06F 3/04166; G06F 3/04164; G06F 3/0443; G06F 2203/04112; H01L 27/323
USPC ....................................................... 345/174
See application file for complete search history.

(56) References Cited

U.S. PATENT DOCUMENTS

| | | | |
|---|---|---|---|
| 2014/0240291 A1* | 8/2014 | Nam .................... | G06F 3/04166 345/174 |
| 2020/0210025 A1* | 7/2020 | Kim ........................ | G06F 3/044 |
| 2021/0055823 A1* | 2/2021 | Guo ..................... | G06F 3/04166 |

* cited by examiner

*Primary Examiner* — Jimmy H Nguyen
(74) *Attorney, Agent, or Firm* — Polsinelli PC

(57) ABSTRACT

A touch display device and a touch driving method thereof enable to effectively identify a ghost touch while reducing a number of touch lines and touch sensing units by differently disposing an arrangement of the touch electrodes to which the touch lines are connected for each touch block.

17 Claims, 8 Drawing Sheets

TOUCH DISPLAY DEVICE AND TOUCH DRIVING METHOD HEREOF

CROSS REFERENCE TO RELATED APPLICATION

This application claims priority from Korean Patent Applications No. 10-2020-0112064, filed on Sep. 3, 2020, which is hereby incorporated by reference in its entirety.

BACKGROUND

Field of the Disclosure

Aspects of the present disclosure relate to a touch display device and a touch driving method thereof.

Description of the Background

As the information society develops, the demand for display devices for displaying images is increasing in various forms. Recently, various display devices such as a liquid crystal display device, plasma display panel, and an organic light emitting display device have been used.

Among these, the liquid crystal display device displays the image by adjusting the light transmittance of the liquid crystal using an electric field. To this end, the liquid crystal display device may include a liquid crystal display panel in which liquid crystal cells are arranged in a matrix form, and a driving circuit for driving the liquid crystal display panel.

A plurality of gate lines and data lines intersects with each other in a pixel array of the liquid crystal display panel, and a thin film transistor (TFT) for driving the liquid crystal cell is formed at the intersection of the gate line and the data line. In addition, a storage capacitor for maintaining a voltage of a liquid crystal cell is formed in the liquid crystal display panel, and the liquid crystal cell includes a pixel electrode, a common electrode, and a liquid crystal layer. The electric field is formed in the liquid crystal layer of the liquid crystal cells by the data voltage supplied to the pixel electrode and the common voltage supplied to the common electrode. At this time, a display image is realized by controlling the amount of light that passes through the liquid crystal layer by the electric field.

The driving circuit includes a gate driving circuit for sequentially supplying a gate signal to the gate line, and a data driving circuit for supplying a data voltage (image signal) to the data line. The data driving circuit drives the data lines to supply data voltages to the liquid crystal cells. The gate driving circuit sequentially drives the gate lines to select liquid crystal cells of the display panel to which the data voltage is supplied by one horizontal line.

The gate driving circuit includes a gate shift register comprised of a plurality of stages to sequentially generate gate signals. Each stage of the shift register generates a gate clock signal and the gate signal with a low level voltage by alternately charging and discharging. Each of the output terminals of the stages is connected to the gate line in a 1:1 manner. The gate signals with a first level are sequentially generated from the stages once per frame and supplied to the corresponding gate lines.

On the other hand, in providing a touch input function in the display device, an in-cell type touch display devices in which elements constituting a touch screen in the display panel of the touch display device have been developed and used, in order to slim mobile terminals such as a smartphone and a tablet PC.

Such a touch display device uses the common electrode for driving each pixel as a touch electrode for sensing a touch. Accordingly, a common voltage is provided to the thin film transistor during the display driving period, and a touch driving signal is provided to the touch electrode during the touch sensing period.

In this case, if a number of touch electrodes is increased to improve the touch sensitivity, a number of touch lines connected to the touch electrodes and a number of touch sensing units for sensing a touch signal are also increased.

Accordingly, a driving method for reducing the touch lines and the touch sensing units may be used by dividing the area of the display panel and connecting a touch line to each touch electrode in each divided area.

However, in the case of dividing the area of the display panel and connecting a touch line to a plurality of touch electrodes, the touch signal is overlapped. Therefore, a method of distinguishing a ghost touch that appears in an actually untouched area among the divided areas is required.

SUMMARY

Accordingly, the present disclosure provides a touch display device and a touch driving method thereof enable to distinguish between an actual touch and a ghost touch.

In addition, the present disclosure provides a touch display device and a touch driving method thereof enable to effectively identify the ghost touch while reducing a number of touch lines and touch sensing units by differently disposing the arrangement of the touch electrodes to which the touch lines are connected for each touch block.

According to an aspect, aspects of the present disclosure may provide a touch display device comprising: a display panel including a plurality of touch electrodes arranged in a plurality of divided touch blocks, and a plurality of touch lines which is extended in a first direction and connected to at least one touch electrode for each touch block; and a touch circuit for receiving touch sensing signals from the plurality of touch lines and determining a touch according to a distribution of the touch sensing signals detected for each touch block.

According to an aspect, the plurality of touch electrodes are arranged in a split type separated from each other in row and column directions in the touch block.

According to an aspect, the plurality of touch electrodes are arranged in a woven type having different sizes of the touch electrodes disposed in adjacent row in the touch block.

According to an aspect, the plurality of touch electrodes are arranged in different numbers for at least two or more touch blocks.

According to an aspect, the plurality of touch lines are respectively connected to touch electrodes apart from a reference touch electrode in the touch block by a predetermined jumping interval.

According to an aspect, the reference touch electrode is a touch electrode located at a first row in the touch block.

According to an aspect, the jumping interval has different values between at least two or more touch lines disposed in the same touch block.

According to an aspect, the jumping interval has a value sequentially increasing or decreasing for each of the touch blocks in the first direction.

According to an aspect, the value sequentially increasing or decreasing for each of the touch blocks is a value that does not correspond to a divisor (except 1) of a number of touch electrodes disposed in the first direction within the touch block.

According to an aspect, the touch circuit determines a touch in a corresponding touch block as an actual touch when a distribution of the touch sensing signals is a normal distribution or a Gaussian distribution.

According to another aspect, aspects of the present disclosure may provide a touch driving method for a display panel including a plurality of touch electrodes arranged in a plurality of divided touch blocks and a plurality of touch lines which is extended in a first direction and connected to at least one touch electrode for each touch block comprising: detecting touch sensing signals for each touch block; detecting a touch electrode with the highest intensity of the touch sensing signal in each of the touch blocks; detecting the touch sensing signals according to a distance based on the touch electrode with the highest intensity; determining whether the touch sensing signals according to a distance based on the touch electrode with the highest intensity is a predetermined distribution according to a distance based on the touch electrode with the highest intensity; and determining a touch ghost if it is not the predetermined distribution.

In according to exemplary aspects of the present disclosure, it may provide a touch display device and a touch driving method thereof enable to distinguish between an actual touch and a ghost touch.

In according to exemplary aspects of the present disclosure, it may provide a touch display device and a touch driving method thereof enable to effectively identify the ghost touch while reducing a number of touch lines and touch sensing units by differently disposing the arrangement of the touch electrodes to which the touch lines are connected for each touch block.

DESCRIPTION OF DRAWINGS

The above and other features, and advantages of the present disclosure will be more clearly understood from the following detailed description, taken in conjunction with the accompanying drawings, in which.

DETAILED DESCRIPTION

Figure 1:
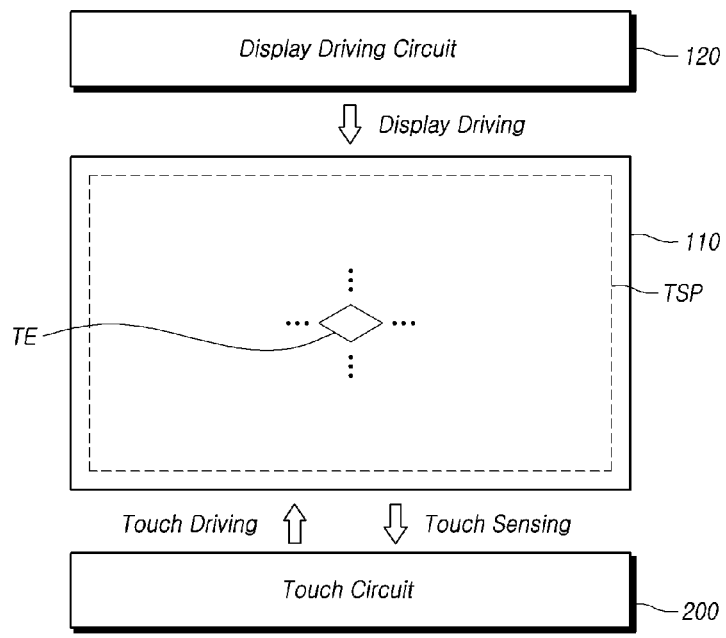
FIG. 1 illustrates a block diagram of a touch display device according to aspects of the present disclosure.

In the following description of examples or aspects of the present disclosure, reference will be made to the accompanying drawings in which it is shown by way of illustration specific examples or aspects that can be implemented, and in which the same reference numerals and signs can be used to designate the same or like components even when they are shown in different accompanying drawings from one another. Further, in the following description of examples or aspects of the present disclosure, detailed descriptions of well-known functions and components incorporated herein will be omitted when it is determined that the description may make the subject matter in some aspects of the present disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after", "subsequent to", "next", "before", and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompass all the meanings of the term "can".

FIG. 1 illustrates a block diagram of a touch display device according to aspects of the present disclosure.

Referring to FIG. 1, the touch display device 100 according to aspects of the present disclosure may have a function of displaying images and a function of sensing a touch from a user.

In order to implement both a function of displaying the images and a function of sensing a touch, the touch display device 100 may include a display panel 110 in which a plurality of data lines and a plurality of gate lines are arranged, a display driving circuit 120 for driving the display panel 110, and the like.

In terms of functionality, the display driving circuit 120 may include a data driving circuit for driving the data lines, a gate driving circuit for driving the gate lines, and a controller for controlling the data driving circuit and the gate driving circuit. The display driving circuit 120 may be implemented as one or more integrated circuits.

The touch display device 100 may include a touch screen panel TSP in which a plurality of touch electrodes TE for sensing touches are arranged, and a touch circuit 200 for driving the touch screen panel TSP and processing signals related to touches.

The touch screen panel TSP in the touch display device 100 may be an external type in which the touch screen panel TSP is manufactured separately from the display panel 110 and thereafter bonded with the display panel 110, or an embedded type in which the touch screen panel TSP is manufactured together with the display panel 110 and located inside of the display panel 110.

Thus, the touch screen panel TSP in the touch display device 100 according to aspects may be an independent panel having a function of sensing a touch, or a display panel 110 having a function of displaying together with the function of sensing a touch. Hereinafter, for convenience of description, it is assumed that the display panel 110 includes the touch screen panel TSP.

The touch circuit 200 may provide a touch driving signal to the display panel 110 for driving the display panel 110, receive a touch sensing signal from the display panel 110, and detect a touch presence or a touch coordinate based on the touch sensing signal.

The touch circuit 200 may include a touch sensing circuit for providing the touch driving signal and receiving the touch sensing signal, and a touch controller for detecting the touch presence or calculating the touch coordinate.

The touch circuit 200 may be implemented as one or more components like integrated circuits, or implemented separately from the display driving circuit 120.

Further, all or at least a part of the touch circuit 200 may be implemented by being integrated with the display driving circuit 120 or an inner circuit of the display driving circuit 120. For example, the touch sensing circuit of the touch circuit 200 may be implemented as an integrated circuit with the data driving circuit of the display driving circuit 120.

Meanwhile, the touch display device 100 may sense the touch presence or the touch coordinate based on capacitance formed by touch electrodes TE.

The touch display device 100 may sense a touch by a mutual-capacitance scheme or a self-capacitance scheme, as a capacitance based touch sensing scheme.

In case of a touch sensing scheme based on mutual-capacitance, a plurality of touch electrodes TE may be classified as touch driving electrodes which is supplied touch driving signals through touch driving lines, and touch sensing electrodes which forms capacitances with the touch driving electrodes and supplies touch sensing signals through touch sensing lines. Here, the touch driving lines and the touch sensing lines may be referred to as touch lines.

In case of the touch sensing scheme based on mutual-capacitance, the touch presence and the touch coordinate may be detected based on a change of mutual-capacitance formed between the touch driving electrode and the touch sensing electrode according to a presence or absence of a pointer such as a finger, a pen, or the like.

In case of the touch sensing scheme based on self-capacitance, each touch electrode serves as both the touch driving electrode and the touch sensing electrode. That is, a touch driving signal is supplied to a touch electrode TE through a touch line, and a touch sensing signal generated in the touch electrode, to which the touch driving signal is supplied, is transmitted through the same touch line. Accordingly, in case of the touch sensing scheme based on self-capacitance, there is no distinction between the touch driving electrode and the touch sensing electrode and no distinction between the touch driving line and the touch sensing line.

In case of the touch sensing scheme based on self-capacitance, the touch presence and a touch coordinate may be detected based on a change in capacitance formed between a pointer such as a finger, a pen, or the like, and a touch electrode TE.

Thus, the touch display device 100 may sense a touch by the touch sensing scheme based on mutual-capacitance or the touch sensing scheme based on self-capacitance.

Further, such a touch display device 100 may be various types of display devices, such as a liquid crystal display device, an organic light emitting display device, a plasma display panel, a quantum dot display device, and the like.

For example, when the touch display device 100 according to aspects is a liquid crystal display device, a plurality of touch electrodes TE may be arranged on the display panel 110, and may be common electrodes to which a common voltage for displaying images is applied.

Figure 2:
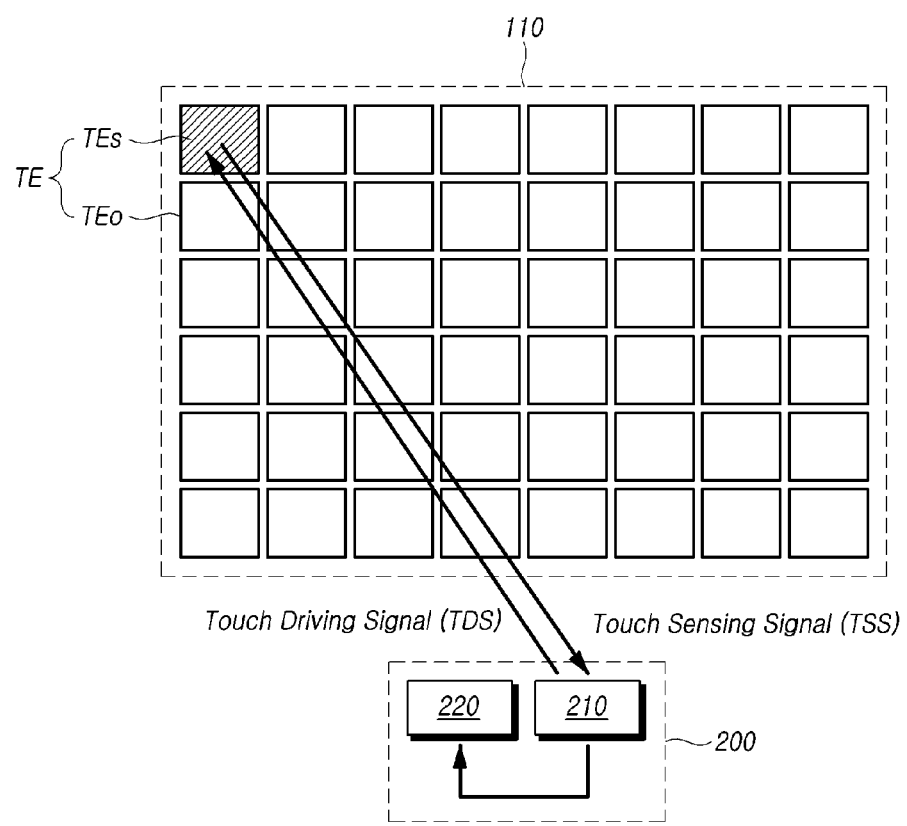
FIG. 2 illustrates an example of touch driving and sensing operations in the touch display device according to aspects of the present disclosure.

FIG. 2 illustrates an example of touch driving and sensing operations in the touch display device according to aspects of the present disclosure.

Referring to FIG. 2, the touch display device 100 according to aspects of the present disclosure includes a plurality of touch electrodes TE serving as a touch sensor to provide a touch sensing function, a touch circuit 200 detecting a touch by sequentially driving the touch electrodes TE, and the like.

The touch circuit 200 may detect the touch presence and a touch coordinate by sequentially driving and sensing a plurality of touch electrodes TE in a touch sensing period in which touch sensing is performed.

More specifically, the touch circuit 200 may select at least one touch electrode among a plurality of touch electrodes TE as a touch electrode TEs to be sensed, and provide a touch driving signal TDS to the selected touch electrode TEs. Thereafter, the touch circuit 200 may detect the touch presence or a touch coordinate by determining a change in capacitance (or a change in voltage, a change in an amount of charge, or the like) for each touch electrode TE based on touch sensing signals TSS received from the selected touch electrode TEs and non-selected touch electrode TEo.

The touch circuit 200 may include, for example, a touch controller 220 controlling a generation of signals related to touch detection, and performing a process for detecting a touch presence and calculating a touch coordinate, and a touch sensing circuit 210 providing the touch driving signal TDS to the display panel 110, detecting the touch sensing signal TSS from the touch electrode TEs to which the touch driving signal TDS is provided, and providing the detected the touch sensing signal TSS to the touch controller 220.

Here, the touch sensing period for detecting a touch may be separated in time from a display driving period in which images are displayed on the display panel 110, or be concurrently performed with the display driving period.

Further, a load-free driving process for reducing parasitic capacitance formed through at least one touch electrode TE may be performed by providing an alternating current signal with the same phase and amplitude as the touch driving signal TDS to at least one data line and at least one gate line of the display panel 110 in the touch sensing period. In this case, the touch driving signal TDS may correspond to a load-free driving signal.

In this case, a size of the touch electrode TE disposed on the display panel 110 may correspond to a size of one subpixel or a size of two or more subpixels. In addition, each touch electrode TE may be a plate type without openings or a mesh type with one or more openings.

If one touch electrode TE is a mesh type and has a size corresponding to a size of two or more subpixels, one touch electrode TE has two or more openings, and a position and a size of each of the two or more openings may correspond to a position and a size of the light emitting area of the subpixel.

In this case, the display panel 110 is may be a split type in which each of the plurality of touch electrodes TE with same size is separated from each other, or an woven type in which touch electrodes TE with different sizes are arranged in adjacent rows or columns.

Figure 3:
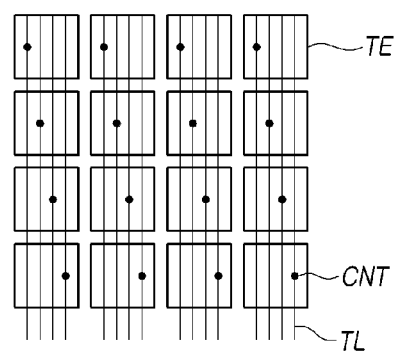
FIG. 3 illustrates a display panel comprised of split type touch electrodes in a touch display device according to aspects of the present disclosure.

FIG. 3 illustrates a display panel comprised of split type touch electrodes in a touch display device according to aspects of the present disclosure.

Referring to FIG. 3, when a plurality of split type touch electrodes TE are disposed in the display panel 110 of the touch display device 100 according to aspects, each of a plurality of touch electrodes TE may be electrically connected with touch lines TL through one or more contact holes CNT.

The plurality of touch electrodes TE may be positioned in an active area. Depending on cases, some (e.g., outermost touch electrodes) of the plurality of touch electrodes TE may be positioned in an outside area (bezel area) of the active area or may extend to the outside area (bezel area) of the active area. The active area may be an area in which images are displayed or touch sensing process is performed.

A plurality of touch lines TL electrically connected to the plurality of touch electrodes TE may be positioned in an active area. Depending on cases, all or some of the plurality of touch lines TL may be positioned at outside area of the active area. When the plurality of touch lines TL electrically connected to the plurality of touch electrodes TE are positioned in the active area, the plurality of touch lines TL may be overlapped the plurality of touch electrodes TE by positioning in a layer different from the plurality of touch electrodes TE.

The plurality of touch lines TL all may have the same or similar length and may be disposed from a point connected with the touch sensing circuit 210 to the opposite point. The plurality of touch lines TL may be different only in the position (i.e., the position of the contact hole CNT) where they are respectively connected with the corresponding touch electrodes TE.

In a case of a split type display panel 110, if one touch electrode TE is electrically connected with one touch line TL, there should be a plurality of touch lines TL as many as the number of a plurality of touch electrodes TE. The number of the plurality of touch lines TL may correspond to the number of touch channels for signal input and output of the touch sensing circuit 220.

Accordingly, in case of a split type display panel 110 composed of 4×4 touch electrodes TE in which sixteen touch electrodes TE are arranged in four rows and four columns, sixteen touch lines TL and sixteen touch channels may exist.

As described above, if the touch lines TL are connected to each of the touch electrodes TE, the touch lines TL are required as many as the number of touch electrodes TE disposed in the display panel 110. As a result, the number of touch lines TL and touch channels increases, and the configuration of the touch circuit 200 may be complicated.

In order to solve the above problem, the display panel 110 may be divided into a certain number of touch blocks, and the touch electrodes TE adjacent in a direction orthogonal to the touch lines TL may be connected with different jumping intervals for each touch block. Therefore, the number of touch lines TL and touch channels may be reduced, and touch ghosts may be distinguished.

Figure 4:
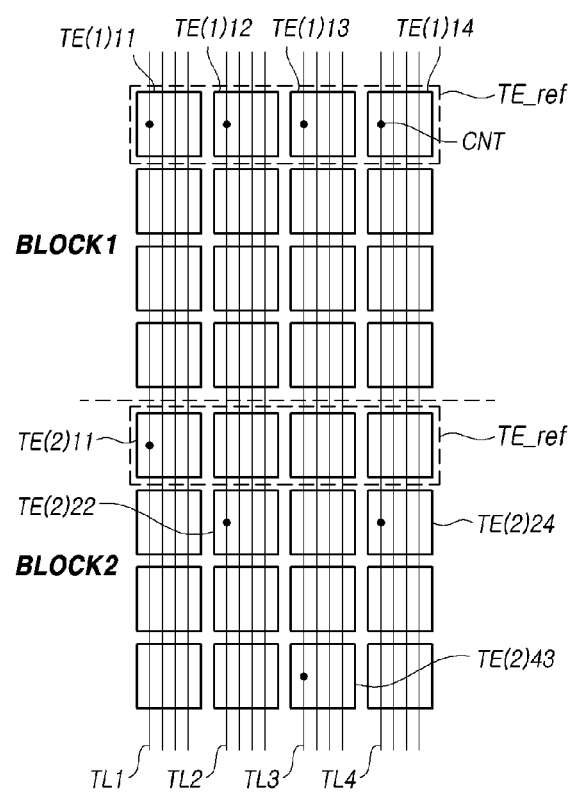
FIG. 4 illustrates a diagram in which a display panel is divided into a plurality of touch blocks and a touch line is connected to each of the divided touch blocks at different jumping intervals in a touch display device according to aspects of the present disclosure.

FIG. 4 illustrates a diagram in which a display panel is divided into a plurality of touch blocks and touch lines are connected to each of the divided touch blocks at different jumping intervals in a touch display device according to aspects of the present disclosure.

Referring to FIG. 4, in the display panel 110 of the touch display device 100 according to aspects of the present disclosure, a plurality of touch electrodes TE which are common electrodes used in a display driving period may be divided into a plurality of blocks.

In this case, the plurality of touch electrodes TE may be arranged in a horizontal row direction and a vertical column direction to be a matrix form. Here, it illustrated a case in which the touch electrodes TE are arranged in four rows and four columns per one touch block BLOCK1, BLOCK2 by simplifying the touch electrodes TE constituting the display panel 110.

Meanwhile, a number of touch electrodes TE disposed in each touch block BLOCK may be the same, but may also be different.

At this time, a first touch block BLOCK1 and a second touch block BLOCK2 operate respectively by supplying gate signals at different timings. However, a touch electrode (e.g., TE(1)11) selected from the first touch block BLOCK1 and a touch electrode (e.g., TE(2)11) selected from second touch block BLOCK2 may be connected to the same touch line (e.g., TL1). Therefore, the touch electrodes TE may be driven with a number of touch lines (the number of touch lines is reduced to ½ in case that two touch blocks are exist in the vertical direction) divided by a number of the touch blocks with respect to the touch electrodes TE arranged in a column.

That is, if a contact hole CNT is formed in a touch electrode TE, eight touch electrodes TE may be arranged in a column. Since these touch electrodes TE may be divided into two touch blocks BLOCK1, BLOCK2, it is possible to connect all of the touch electrodes TE arranged in a row with four touch lines TL.

For example, a first touch line TL1 disposed in a first column of the first touch block BLOCK1 may be connected to a touch electrode TE(1)11 disposed in a first row of the first touch block BLOCK1 and a touch electrodes TE(2)11 disposed in a first row of the second touch block BLOCK2. In addition, a second touch line TL2 of a second column may be connected to a touch electrode TE(1)12 disposed in the first row of the first touch block BLOCK1 and a touch electrode TE(2)22 disposed in the second row of the second touch block BLOCK2.

At this time, if the arrangement of the touch electrode in which the contact hole CNT is located in the first touch block BLOCK1, and a touch electrode in which the contact hole CNT is located in the second touch block BLOCK2, is the same, it may be difficult to distinguish between an actual touch and a ghost touch with respect to touch lines (e.g., For example, TL1, TL2, TL3, TL4) respectively connecting adjacent touch electrodes (e.g., TE(1)11, TE(1)12, TE(1)13, TE(1)14) in the row direction because the same touch sensing signal is generated for each touch block BLOCK.

Accordingly, locations of the touch electrodes TE connected by a touch line TL in each of the touch blocks BLOCK1, BLOCK2 may be different from each other in order to distinguish between an actual touch and a ghost touch.

For the purpose of above, the location of the contact hole CNT may be determined from the reference touch electrode TE_ref at different jumping intervals for each divided touch block BLOCK with respect to the touch line TL connected to the adjacent touch electrode TE.

For example, if the reference touch electrode TE_ref is determined as a touch electrode located at the first row in each touch block BLOCK, the touch line TL1 in the first column may be connected to the touch electrode TE(1)11 located at the first row of the first touch block BLOCK1 and to the touch electrode TE(2)11 located at the first row of the second touch block BLOCK2, so that an increment of the jumping interval may be 0 (jumping interval is 4) for each touch block.

Meanwhile, an increment of the jumping interval may be 1 (jumping interval is 5) for each touch block by connecting the touch line TL2 in the second column to the touch electrode TE(1)12 located at the first row of the first touch block BLOCK1 and to the touch electrode TE(2)22 located at the second row of the second touch block BLOCK2. In this case, the touch line TL2 in the second column may be connected to a touch electrode located at the third row in the third touch block.

In addition, an increment of the jumping interval may be 3 (jumping interval is 7) for each touch block by connecting the touch line TL3 in the third column to the touch electrode TE(1)13 located at the first row of the first touch block BLOCK1 and to the touch electrode TE(2)43 located at the fourth row of the second touch block BLOCK2. In this case, the touch line TL3 in the third column may be connected to a touch electrode located at the third row (each touch block is comprised of 4 rows, so the seventh row corresponds to the third row) in the third touch block.

In this way, when the touch electrodes TE connected by a touch line TL for each of the touch blocks BLOCK1, BLOCK2 have different arrangement with each other, it is possible to distinguish between an actual touch and a ghost touch because the distribution of the touch sensing signal TSS is different for each of the touch blocks BLOCK1, BLOCK2 in the relationship between the adjacent touch electrodes TE.

Here, it illustrated the case that the location of the reference touch electrode TE_ref for each touch block BLOCK is determined by the touch electrodes TE(1)11, TE(1)12, TE(1)13, TE(1)14 in the first row. However, the location of the reference touch electrode TE_ref may be determined to the same row, or may be determined to different rows for each column to which the touch line TL is connected.

In this case, the method of differentiating the arrangement of the touch electrodes TE connected to a touch line TL for each of the touch blocks BLOCK1, BLOCK2 may be varied depending on the number of the touch electrodes TE.

However, the increment of the jumping interval for each touch block BLOCK may be set as not equal to a divisor except 1 (the divisor of 4 is 1, 2, 4, so it becomes 2 and 4 except 1) of the number of rows of a touch block BLOCK.

For example, when the number of touch blocks BLOCK is 3 or more and the increment of the jumping interval has a divisor of the number of touch electrodes TE arranged in the column direction within a touch block BLOCK (for example, the increment of the jumping interval is 2 from a case that 4 touch electrodes are arranged in the column direction within a touch block), the structure to which the touch lines TL are connected may have the same arrangement in the first touch block BLOCK1 and the third touch block BLOCK3 in the column direction.

As a result, it may be difficult to identify a touch ghost if the arrangement of the touch electrodes TE connected to the same touch line TL for each touch block BLOCK is configured to the same structure.

Therefore, the increment of the jumping interval for connecting the touch line TL for each of the touch blocks BLOCK is 0, 1, and 3 due to the divisors except 1 are 2 and 4 if four touch electrodes TE may be arranged in a direction parallel to the touch line TL in each of the touch blocks BLOCK.

On the other hand, as described above, since the touch line TL1 of the first column to the touch line TL3 of the third column have respectively the increment of the jumping interval of 0, 1, and 3, so the touch line TL4 of the fourth column may have a increment of the jumping interval selected from 0, 1, and 3. Here, it illustrated a case that the increment of the jumping interval of the touch line TL4 in the fourth column for each touch blocks is 1.

As described above, when the touch electrodes TE connected to the same touch line TL for each touch block BLOCK have different arrangement, it is possible to distinguish a touch ghost by determining a touch block having a normal distribution or a Gaussian distribution centered on a specific touch electrode TE as an actual touch after detecting a distribution of the touch sensing signal TSS for each of the touch blocks BLOCK.

Figure 5:
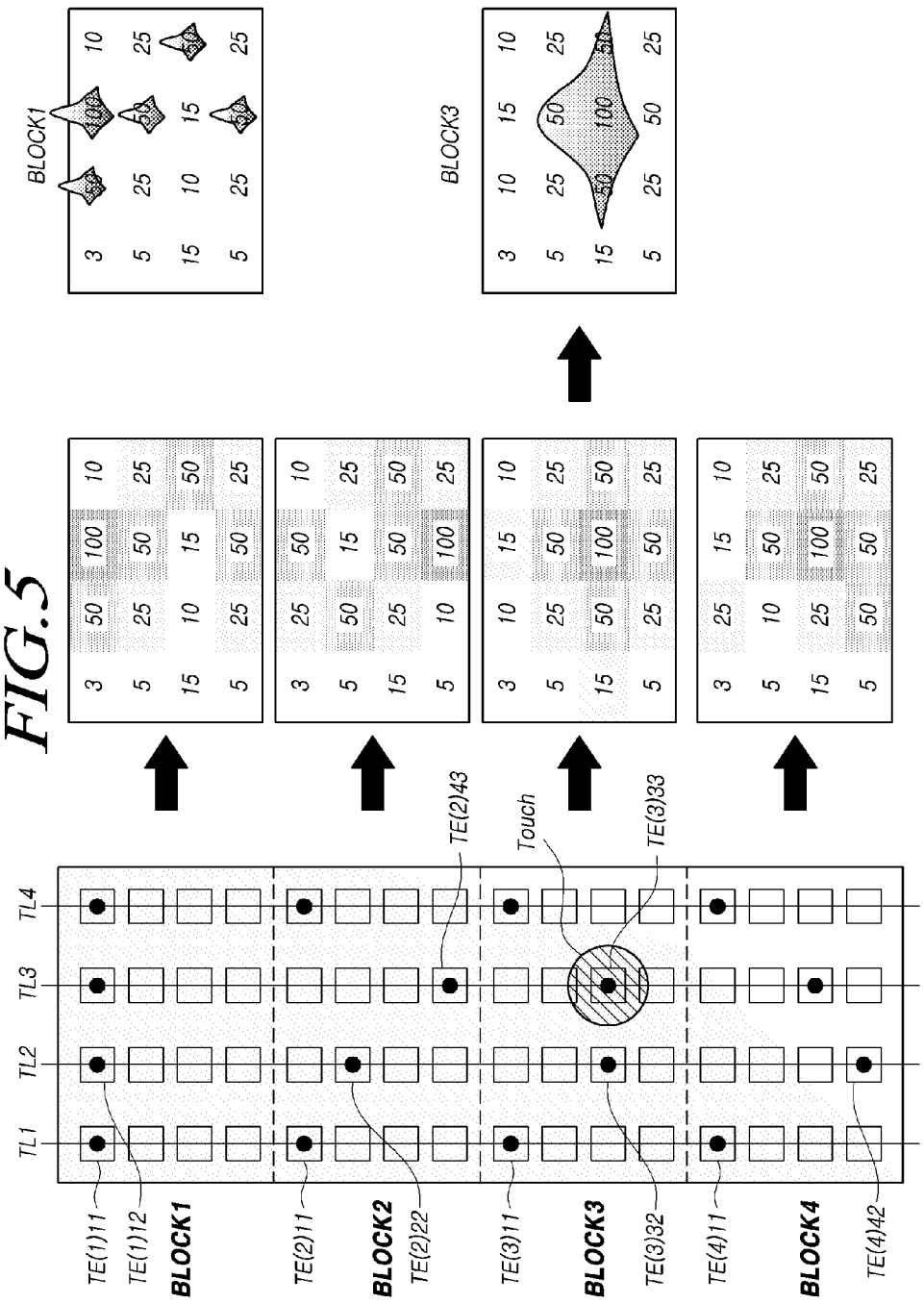
FIG. 5 illustrates a diagram for detecting a touch in a state that a display panel is divided into a plurality of touch blocks and a touch line is connected to each of the divided touch blocks at different jumping intervals in a touch display device according to aspects of the present disclosure.

FIG. 5 illustrates a diagram for detecting a touch in a state that a display panel is divided into a plurality of touch blocks and a touch line is connected to each of the divided touch blocks at different jumping intervals in a touch display device according to aspects of the present disclosure.

Referring to FIG. 5, for example, the display panel 110 in the touch display device 100 according to aspects of the present disclosure may be divided into four touch blocks BLOCK1-BLOCK4 in a direction of the touch line TL, and each of the touch blocks BLOCK1-BLOCK4 may include 16 touch electrodes TE in a matrix of 4×4.

In this case, the reference touch electrode TE_ref may be a touch electrode (e.g., TE(1)11) located at the first row in each of the touch blocks BLOCK1-BLOCK4.

Here, it illustrates a case that the touch line TL1 in the first column has an increment of the jumping interval 0 for each touch block, the touch line TL2 in the second column has an increment of the jumping interval 1 for each touch block, and the touch line TL3 in the third column has an increment of the jumping interval 3 for each touch block.

Since the jumping interval of the touch line TL1 in the first column may increase sequentially by 0 from the touch electrode of the first row (e.g., TE(1)11), which is the reference touch electrode TE_ref, the touch line TL1 in the first column may be connected respectively to the touch electrodes TE(1)11, TE(2)11, TE(3)11, TE(4)11 located at the first row of the each touch block BLOCK1-BLOCK4.

Since the jumping interval of the touch line TL2 in the second column may increase sequentially by 1 from the touch electrode of the first row (e.g., TE(1)12), which is the reference touch electrode TE_ref, the touch line TL2 in the second column may be connected respectively to the touch electrodes TE(1)12 located at the first row of the first touch block BLOCK1, the touch electrodes TE(2)22 located at the second row of the second touch block BLOCK2, the touch electrodes TE(3)32 located at the third row of the third touch block BLOCK3, and the touch electrodes TE(4)42 located at the fourth row of the fourth touch block BLOCK4.

Since the jumping interval of the touch line TL3 in the third column may increase sequentially by 3 from the touch electrode of the first row (e.g., TE(1)13), which is the reference touch electrode TE_ref, the touch line TL3 in the third column may be connected respectively to the touch electrodes TE(1)13 located at the first row of the first touch block BLOCK1, the touch electrodes TE(2)43 located at the fourth row of the second touch block BLOCK2, the touch electrodes TE(3)33 located at the third row of the third touch block BLOCK3, and the touch electrodes TE(4)23 located at the second row of the fourth touch block BLOCK4.

On the other hand, when each touch block BLOCK1-BLOCK4 includes four touch electrodes TE in a column direction, 2 or 4 may not be selected, which is divisor of 4 except 1 as an increment of the jumping interval. Accordingly, the increment of the jumping interval for the touch line TL4 of the fourth column may be selected from 0, 1, and 3. Here, it illustrated that the jumping interval of the touch line TL4 in the fourth column increases by 0 for each touch block.

As described above, when the touch lines TL connected to a plurality of touch blocks BLOCK1-BLOCK4 have different jumping intervals for each touch block, the touch electrodes TE located within each of the touch blocks BLOCK1-BLOCK4 may have different arrangement for each touch block.

In the above, it illustrated a case where each touch line TL connected to the plurality of touch blocks BLOCK1-BLOCK4 increases at different jumping intervals for each touch block as an example, but each touch line TL connected to the plurality of touch blocks BLOCK1-BLOCK4 may sequentially decrease at different jumping intervals for each touch block.

For example, the jumping interval for the touch line TL2 of the second column may decrease by 1 from the touch electrode (e.g., TE(1)12) of the first row, which is the reference touch electrode TE_ref. Also, the jumping interval for the touch line TL3 of the third column may decrease by 3 from the touch electrode (e.g., TE(1)13) of the first row, which is the reference touch electrode TE_ref.

Meanwhile, all the touch electrodes connected by the same touch line may be arranged with the same jumping interval. On the other hand, touch electrodes connected by the same touch line may be arranged with different jumping intervals.

In this state, when a touch occurs on a touch electrode TE, the value of the touch sensing signal TSS detected from the touch electrode TE located at the touch point indicates the highest intensity, and the intensity of the touch sensing signal TSS appears higher as the touch electrode is closer to the touch electrode with the highest intensity.

Accordingly, the intensity of the touch sensing signal TSS exhibits a normal distribution or a Gaussian distribution according to distances of the touch electrodes from the touch electrode with the highest intensity around the touch point in a touch block in which a touch actually occurs.

On the other hand, the intensity of the touch sensing signal TSS may have irregular distribution according to the distance of the touch electrodes from the touch electrode with the highest intensity in a touch block where no actual touch occurs, since the arrangement of the touch electrodes TE connected to the touch line TL is different for each touch block BLOCK1-BLOCK4.

Here, it illustrates a case in which a touch occurs at the touch electrode TE(3)33 located at a third row and a third column of the third touch block BLOCK3 as an example.

When a touch occurs in the touch electrode TE(3)33 located at the third row and the third column of the third touch block BLOCK3, the touch electrode TE(3)33 located at the third row and the third column of the third touch block BLOCK3 may have the highest intensity of the touch sensing signal TSS. Also, a touch electrode (e.g., TE(3)32, etc.) adjacent to the touch electrode TE(3)33 located at the third row and the third column may have a high intensity of the touch sensing signal TSS due to the coupling effect.

Figure 6:
FIG. 6 illustrates a diagram in which distributions of touch sensing signals detected by touch electrodes in a third touch block with an actual touch are arranged in order of high intensity in the case of FIG. 5.

FIG. 6 illustrates a diagram in which distributions of touch sensing signals detected by touch electrodes in a third touch block with an actual touch are arranged in order of intensity in the case of FIG. 5.

Referring to the distribution of the touch sensing signals TSS, the touch electrode TE having the highest intensity of the touch sensing signal TSS may be the touch electrode TE(3)33 located at the third row and the third column with the actual touch.

At this time, the touch electrodes TE(3)33 located at the third row and third column of the third touch block BLOCK3 are connected to the touch electrode TE(1)13 located at the first row and third column of the first touch block BLOCK1, the touch electrode TE(2)43 located at the fourth row and third column of the second touch block BLOCK2, and the touch electrode TE(4)24 located at the second row and fourth column of the fourth touch block BLOCK4. Accordingly, the touch sensing signal TSS detected by these touch electrodes TE(1)13, TE(2)43, TE(4)24 may be the same as that of the touch electrode TE(3)33 located at the third row and third column of the third touch block BLOCK3.

In the third touch block BLOCK3 where the actual touch has occurred, the touch electrodes TE closest to the touch electrode TE(3)33 located at the third row and third column may be a touch electrode TE(3)23 located at second row and third column, a touch electrode TE(3)32 located at third row and second column, a touch electrode TE(3)34 located at third row and fourth column, and a touch electrode TE(3)43 located at fourth row and third column adj acent in the horizontal and vertical directions.

Accordingly, the touch sensing signals TSS detected from the touch electrode TE(3)23 located at second row and third column, the touch electrode TE(3)32 located at third row and second column, the touch electrode TE(3)34 located at third row and fourth column, and the touch electrode TE(3)43 located at fourth row and third column may have a second highest intensity (e.g., 50) lower than the highest intensity (e.g., 100) detected from the touch electrode TE(3)33 located at the third row and third column.

However, the touch electrodes TE in other touch blocks BLOCK1, BLOCK2, BLOCK4 connected to the touch electrodes TE(3)23 located at the second row and third column of the third touch block BLOCK3 through the touch line TL may have different jumping intervals. Accordingly, since each touch electrode TE is not located at the second row and the third column in the corresponding touch block, the distribution of the touch sensing signal TSS may be different. The same intensity of touch sensing signal TSS may be detected by the touch electrodes TE in other touch blocks BLOCK1, BLOCK2, BLOCK4 connected to the touch electrode TE(3)32 located at third row and second column, the touch electrode TE(3)34 located at third row and fourth column, and the touch electrode TE(3)43 located at fourth row and third column of the third touch block BLOCK3 through the touch line TL.

Accordingly, the distribution of the touch electrodes TE(3)23, TE(3)32, TE(3)34, TE(3)43 with the intensity of the second highest touch sensing signal TSS in the third touch block BLOCK3 may be appeared in different arrangements in different touch blocks BLOCK1, BLOCK2, BLOCK4.

In addition, the touch electrode TE(3)22 located at second row and second column, the touch electrode TE(3)24 located at second row and fourth column, the touch electrode TE(3)42 located at fourth row and second column, and the touch electrode TE(3)44 located at fourth row and fourth column adjacent in the diagonal direction from the touch electrode TE(3)33 with the highest intensity in the third touch block BLOCK3 have a second closest distance from the touch electrode TE(3)33 located at the third row and third column. Accordingly, they may have third-highest intensity (e.g., 25) based on the highest intensity (e.g., 100) detected from the touch electrodes TE(3)33 located at third row and third column.

However, the touch electrodes TE in other touch blocks BLOCK1, BLOCK2, BLOCK4 connected to the touch electrodes TE(3)22 located at the second row and second column of the third touch block BLOCK3 through the touch line TL may have different jumping intervals. Accordingly, the distribution of the touch sensing signal TSS may be different. The same intensity of touch sensing signal TSS may be detected by the touch electrodes TE in other touch blocks BLOCK1, BLOCK2, BLOCK4 connected to the touch electrode TE(3)22 located at second row and second column, the touch electrode TE(3)24 located at second row and fourth column, and the touch electrode TE(3)33 located at third row and third column of the third touch block BLOCK3 through the touch line TL.

In this way, by determining the different jumping interval that increases or decreases for each touch block BLOCK connected to each touch line TL, it is possible to distinguish between an actual touch and a ghost touch since the normal distribution (or Gaussian distribution) of the touch sensing signal TSS generated in the touch block (e.g., BLOCK3) with the actual touch is not formed in the touch blocks (e.g., BLOCK1, BLOCK2, BLOCK4) with no actual touch.

Figure 7:
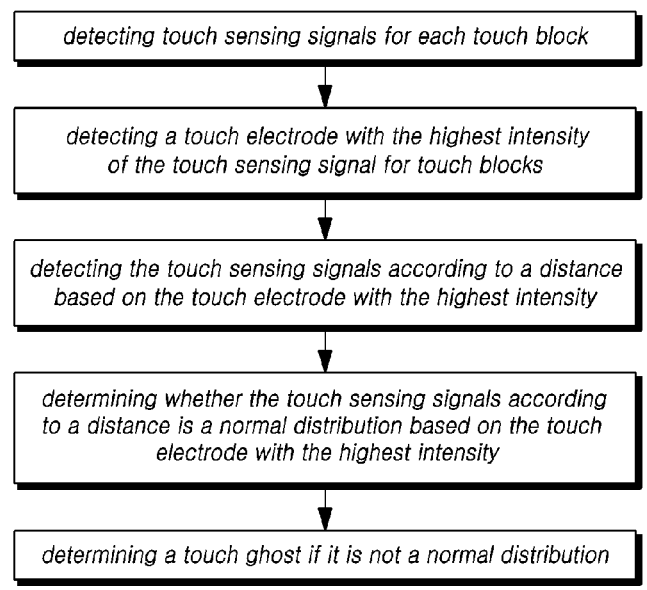
FIG. 7 illustrates a flowchart of a touch driving method for determining a touch ghost in a state that an arrangement of touch electrodes connected to a touch line is differently disposed for each touch block in a touch display device according to aspects of the present disclosure.

FIG. 7 illustrates a flowchart of a touch driving method for determining a touch ghost in a state that an arrangement of touch electrodes connected to a touch line is differently disposed for each touch block in a touch display device according to aspects of the present disclosure.

Referring to FIG. 7, the touch driving method for determining the touch ghost in the state that an arrangement of touch electrodes TE connected to a touch line TL is differently disposed for each touch block BLOCK in a touch display device 100 according to aspects of the present disclosure may include a step of detecting touch sensing signals TSS for each touch block BLOCK, a step of detecting a touch electrode with the highest intensity of the touch sensing signal TSS in each of the touch blocks BLOCK, a step of detecting the touch sensing signals TSS according to a distance based on the touch electrode with the highest intensity, a step of determining whether the touch sensing signals TSS according to a distance based on the touch electrode with the highest intensity is a normal distribution (or a Gaussian distribution) according to a distance based on the touch electrode with the highest intensity, and a step of determining a touch ghost if it is not a normal distribution.

In the step of detecting touch sensing signals TSS for each touch block BLOCK, each touch block BLOCK is selectively driven by the touch circuit 200 to receive touch sensing signals TSS from the touch electrodes TE located in each touch block BLOCK in a state that the display panel 110 is divided into a plurality of touch blocks BLOCK.

In the step of detecting a touch electrode with the highest intensity of the touch sensing signal TSS in each of the touch blocks BLOCK, when a touch sensing signal TSS is detected in an arbitrary touch block BLOCK, the intensities of the touch sensing signals TSS are compared for all the touch electrodes TE arranged in the touch block BLOCK where the touch sensing signal TSS is detected and a touch electrode TE with the highest intensity of the touch sensing signal TSS is detected.

In the step of detecting the touch sensing signals TSS according to a distance based on the touch electrode with the highest intensity, touch sensing signals TSS of each touch electrode TE are sequentially detected from the touch electrodes TE located at the adjacent distance based on the touch electrode with the highest intensity in a state that the touch electrode TE with the highest intensity of the touch sensing signal TSS is determined.

At this time, the touch sensing signal TSS may have higher intensity as the touch electrode TE located at closer distance from the touch electrode with the highest intensity in the touch block BLOCK where the actual touch has occurred. Thus, touch sensing signals TSS may be inversely proportional to the distance from the touch electrode with the highest intensity. That is, touch sensing signals TSS indicating a normal distribution or a Gaussian distribution may be detected according to a distance from the touch electrode with the highest intensity in the touch block BLOCK where the actual touch has occurred.

In the step of determining whether the touch sensing signals TSS according to a distance based on the touch electrode with the highest intensity is a normal distribution (or a Gaussian distribution) according to a distance based on the touch electrode with the highest intensity, it is determined whether touch sensing signals TSS detected from adjacent touch electrodes have a normal distribution or a Gaussian distribution based on a touch electrode with the highest intensity for each touch block BLOCK.

In the step of determining a touch ghost if it is not a normal distribution, it is determined that an actual touch has occurred in the corresponding touch block BLOCK when the touch sensing signals TSS of the adjacent touch electrodes based on a touch electrode with the highest intensity for each touch block BLOCK is the normal distribution (or Gaussian distribution). On the other hand, it is determined that a ghost touch has occurred in the corresponding touch block BLOCK and is excluded from a touch detection when the touch sensing signals TSS of the adjacent touch electrodes based on a touch electrode with the highest intensity for each touch block BLOCK is not the normal distribution (or Gaussian distribution).

As described above, if arrangements of the touch electrodes TE connected to the same touch line TL are different for each touch block BLOCK, the number of touch lines TL and touch channels may be reduced. Also, the actual touch and the ghost touch may be distinguished through the distribution of the touch sensing signals TSS for each touch block BLOCK.

Meanwhile, although the structure of the split type touch electrode TE has been illustrated above as an example, the structure of the touch electrodes TE disposed in the touch block BLOCK may be variously changed.

For example, the sizes of the touch electrodes TE disposed in the touch block BLOCK may be different from each other, and may have different lengths in a certain direction.

Figure 8:
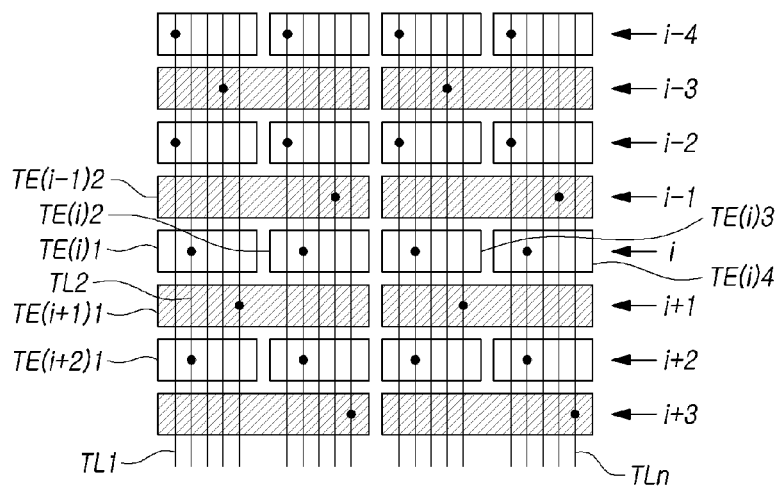
FIG. 8 illustrates a display panel comprised of woven type touch electrodes structure with different sizes of touch electrode disposed in adjacent rows in a touch display device according to aspects of the present disclosure.

FIG. 8 illustrates a display panel comprised of woven type touch electrodes structure with different sizes of touch electrode disposed in adjacent rows in a touch display device according to aspects of the present disclosure.

Referring to FIG. 8, the display panel 110 in which the woven type touch electrodes TE are disposed, in the touch display device 100 according to aspects, has a plurality of touch lines TL that are electrically connected to the plurality of touch electrodes TE through a plurality of contact holes CNT, but sizes of the touch electrodes TE disposed in adjacent rows may be different from each other.

For example, sizes of the touch electrodes TE(i)1, TE(i)2, TE(i)3, TE(i)4 arranged in the ith row (i) may be different from sizes of the touch electrode TE(i−1)2 arranged in the (i−1)th row (i−1) and sizes of the touch electrode TE(i+1)1 arranged in the (i+l)th row (i+1). Accordingly, in the display panel 110 on which the woven type touch electrodes TE are disposed, a number of touch electrodes TE disposed in a plurality of rows i−4, i−3, i−2, i−1, i, i+1, i+2, i+3, may not be same, and any one row (e.g., ith row) of two adjacent rows (e.g., (i+1)th row and ith row) may have a number of touch electrodes TE more than the other row (e.g., (i+1)th row).

At this time, the touch electrodes (e.g., TE(i−1)2 and TE(i+1)1) that are formed long in the row direction may be referred to as long touch electrodes, and the remaining touch electrodes (e.g., TE(i)1, TE(i)2, TE(i)3, TE(i)4, and TE(i+2)1) may be referred to as short touch electrodes.

The display panel 110 may have a matrix structure that a long touch electrode having a long length in a row direction and a short touch electrode having a short length in a row direction are arranged alternately in a column direction.

On the other hand, a certain number of the short touch electrodes having sizes smaller than that of the long touch electrodes may be connected by one touch line TL to correspond to the length of a long touch electrode. For example, a first electrode TE(i)1 in the ith row and a first touch electrode TE(i+2)1 in the (i+2)th row may be electrically connected to each other by one touch line TL2.

In this case, two or more touch electrodes (TE(i)1 and TE(i+2)1) connected by one touch line TL2 are disposed apart from each other by the long touch electrode TE(i+1)1 located in the (i+1)th row, but they may operate as one touch electrode TE because they have same potential states in touch driving process. Therefore, even though two or more short touch electrodes connected by one touch line TL are disposed apart from by other touch electrodes and are arranged in different rows, they are formed as a shout touch electrode block electrically connected by the same touch line TL and may act like one short touch electrode. In this case, a plurality of short touch electrodes connected by same touch line may be referred to as a short touch electrode or may be referred to as a short touch electrode block.

In this way, a short touch electrode block may be formed by connecting a plurality of short touch electrodes to the same touch line TL in a specific number unit. The number of short touch electrodes connected with a same line by one touch line TL may vary depending on the size of the long touch electrodes.

On the other hand, this illustrates a structure in which long touch electrodes having a long length in the row direction are arranged at positions that are not lined up with each other with respect to the long touch electrodes adjacent in the column direction, but the long touch electrodes may be arranged at the positions lined up with each other in the column direction.

As described above, in the case of a woven type touch electrode structure in which a long touch electrode with a long length and a short touch electrode with a short length in a row direction are alternately arranged in a column direction, a touch electrode block BLOCK may include N (N is an integer of 2 or more) number of long touch electrodes with a long length and M (M is an integer of 2 or more) number of short touch electrode blocks which are arranged in parallel and correspond to the long touch electrodes.

For example, when the length of the long touch electrode corresponds to the length of two short touch electrodes, two short touch electrodes arranged in the column direction may constitute a short touch electrode block connected by one same line. Therefore, a touch electrode block BLOCK may be comprised of two long touch electrodes and two short touch electrode blocks each connected by the same line.

Here, a touch electrode block BLOCK may correspond to an area in which the two long touch electrodes and two short touch electrode blocks each connected by the same line are arranged in a size of 2×2.

As described above, in the case of a woven type touch electrode structure having different sizes of the touch electrodes TE arranged in adjacent rows, the area of the touch electrode block BLOCK may be variously changed according to the number of short touch electrodes connected by one touch line TL and the length of the long touch electrodes.

The above description has been presented to enable any person skilled in the art to make and use the technical idea of the present disclosure, and has been provided in the context of a particular application and its requirements. Various modifications, additions and substitutions to the described aspects will be readily apparent to those skilled in the art, and the general principles defined herein may be applied to other aspects and applications without departing from the spirit and scope of the present disclosure. The above description and the accompanying drawings provide an example of the technical idea of the present disclosure for illustrative purposes only. That is, the disclosed aspects are intended to illustrate the scope of the technical idea of the present disclosure. Thus, the scope of the present disclosure is not limited to the aspects shown, but is to be accorded the widest scope consistent with the claims. The scope of protection of the present disclosure should be construed based on the following claims, and all technical ideas within the scope of equivalents thereof should be construed as being included within the scope of the present disclosure.

What is claimed is:

1. A touch display device comprising:
   a display panel including a plurality of touch electrodes arranged in a plurality of divided touch blocks, and a plurality of touch lines, each of the touch lines is extended in a first direction and connected to only one touch electrode for each touch block, wherein each touch block comprises a plurality of rows of touch electrodes and a plurality of columns of touch electrodes; and
   a touch circuit for receiving touch sensing signals from the plurality of touch lines and determining a touch according to a distribution of the touch sensing signals detected for each touch block,
   wherein the plurality of touch lines includes first to third touch lines, and the first touch line is adjacent to the second touch line that is adjacent to the third touch line, wherein each touch block includes reference touch electrodes located at a first row of the plurality of rows, wherein the first touch line is connected to a first touch electrode located at the first row and a first column of a first block, the second touch line is connected to a second touch electrode located at the first row and a second column of the first block, and the third touch line is connected to a third touch electrode located at the first row and a third column of the first block, wherein the first touch line is connected to a first touch electrode located at a first row and a first column of a second block with a first jumping interval being an increment from the first touch electrode at the second touch block to a corresponding reference touch electrode at the first column of the second touch block, the second touch line is connected to a second touch electrode located at a second row and a second column of the second block with a second jumping interval being an increment from the second touch electrode at the second touch block to a corresponding reference touch electrode at the second column of the second touch block and greater than the first jumping interval, and the third touch line is connected to a third touch electrode located at a fourth row and a third column of the second block with a third jumping interval being an increment from the third touch electrode at the second touch block to a corresponding reference touch electrode at the third column of the second touch block and greater than the second jumping interval.

2. The touch display device according to claim 1, wherein the plurality of touch electrodes are arranged in a split type separated from each other in row and column directions in the touch block.

3. The touch display device according to claim 1, wherein the plurality of touch electrodes are arranged in a woven type having different sizes of the touch electrodes disposed in adjacent row in the touch block.

4. The touch display device according to claim 1, wherein the plurality of touch electrodes are arranged in at least two or more touch blocks.

5. The touch display device according to claim 1, wherein the plurality of touch lines are respectively connected to touch electrodes apart from a reference touch electrode in the touch block by the first to third jumping intervals.

6. The touch display device according to claim 5, wherein the reference touch electrode is a touch electrode located at the first row in the touch block.

7. The touch display device according to claim 5, wherein the first to third jumping intervals have a different value among at least two or more touch lines disposed in a same touch block.

8. The touch display device according to claim 5, wherein the first to third jumping intervals have a value sequentially increasing or decreasing among the at least two or more touch lines for each of the touch blocks in the first direction.

9. The touch display device according to claim 8, wherein the value sequentially increasing or decreasing among the at least two or more touch lines for each of the touch blocks is a value that does not correspond to a divisor, except 1 of a number of touch electrodes disposed in the first direction within the touch block.

10. The touch display device according to claim 1, wherein the touch circuit determines a touch in a corresponding touch block as an actual touch when a distribution of the touch sensing signals is a normal distribution or a Gaussian distribution.

11. A touch driving method for a display panel including a plurality of touch electrodes arranged in a plurality of divided touch blocks and a plurality of touch lines each of the touch lines is extended in a first direction and connected to only one touch electrode for each touch block, wherein each touch block comprises a plurality of rows of touch electrodes and a plurality of columns of touch electrodes, the touch driving method comprising:

detecting touch sensing signals for each touch block;

detecting a touch electrode with a highest intensity of the touch sensing signal in each of the touch blocks;

detecting the touch sensing signals according to a distance based on the touch electrode with the highest intensity;

determining whether the touch sensing signals according to a distance based on the touch electrode with the highest intensity is a predetermined distribution according to a distance based on the touch electrode with the highest intensity; and determining a touch ghost if it is not the predetermined distribution, wherein the plurality of touch lines includes first to third touch lines, and the first touch line is adjacent to the second touch line that is adjacent to the third touch line, wherein each touch block includes reference touch electrodes located at a first row of the plurality of rows, wherein the first touch line is connected to a first touch electrode located at the first row and a first column of a first block, the second touch line is connected to a second touch electrode located at the first row and a second column of the first block, and the third touch line is connected to a third touch electrode located at the first row and a third column of the first block, wherein the first touch line is connected to a first touch electrode located at a first row and a first column of a second block with a first jumping interval being an increment from the first touch electrode at the second touch block to a corresponding reference touch electrode at the first column of the second touch block, the second touch line is connected to a second touch electrode located at a second row and a second column of the second block with a second jumping interval being an increment from the second touch electrode at the second touch block to a corresponding reference touch electrode at the second column of the second touch block and greater than the first jumping interval, and the third touch line is connected to a third touch electrode located at a fourth row and a third column of the second block with a third jumping interval being an increment from the third touch electrode at the second touch block to a corresponding reference touch electrode at the third column of the second touch block and greater than the second jumping interval.

12. The touch driving method according to claim 11, wherein the plurality of touch lines are respectively connected to touch electrodes apart from a reference touch electrode in the touch block by the first to third jumping intervals.

13. The touch driving method according to claim 12, wherein the reference touch electrode is a touch electrode located at the first row in the touch block.

14. The touch driving method according to claim 12, wherein the jumping interval has a different value among at least two or more touch lines disposed in a same touch block.

15. The touch driving method according to claim 12, wherein the jumping interval has a value sequentially increasing or decreasing among the at least two or more touch lines for each of the touch blocks in the first direction.

16. The touch driving method according to claim 15, wherein the value sequentially increasing or decreasing among the at least two or more touch lines for each of the touch blocks is a value that does not correspond to a divisor, except 1 of a number of touch electrodes disposed in the first direction within the touch block.

17. The touch driving method according to claim 11, wherein the predetermined distribution is a normal distribution or a Gaussian distribution.

\* \* \* \* \*